(12) United States Patent
Djomehri et al.

(10) Patent No.: US 7,402,868 B2
(45) Date of Patent: Jul. 22, 2008

(54) SYSTEM AND METHOD FOR PROTECTING SEMICONDUCTOR DEVICES

(75) Inventors: Ihsan Jahed Djomehri, Mountain View, CA (US); Mark Randolph, San Jose, CA (US); Yi He, Fremont, CA (US); Wei Zheng, Santa Clara, CA (US)

(73) Assignee: Spansion L.L.C., Sunnyvale, CA (US)

( * ) Notice: Subject to any disclaimer, the term of this patent is extended or adjusted under 35 U.S.C. 154(b) by 105 days.

(21) Appl. No.: 10/976,816

(22) Filed: Nov. 1, 2004

(65) Prior Publication Data

US 2006/0091439 A1    May 4, 2006

(51) Int. Cl.
*H01L 23/62* (2006.01)

(52) U.S. Cl. .................. 257/356; 257/296; 257/355; 257/E29.309; 257/E21.423

(58) Field of Classification Search .............. None
See application file for complete search history.

(56) References Cited

U.S. PATENT DOCUMENTS

| | | | | |
|---|---|---|---|---|
| 4,023,147 A * | 5/1977 | Schuenemann et al. | ..... | 365/149 |
| 4,896,293 A * | 1/1990 | McElroy | ..... | 365/149 |
| 5,504,706 A * | 4/1996 | D'Arrigo et al. | ..... | 365/185.18 |
| 5,637,514 A * | 6/1997 | Jeng et al. | ..... | 438/163 |
| 5,699,294 A * | 12/1997 | Yamada et al. | ..... | 365/175 |
| 5,889,307 A * | 3/1999 | Duesman | ..... | 257/355 |
| 5,898,609 A * | 4/1999 | Yoo | ..... | 365/145 |
| 6,297,984 B1 | 10/2001 | Roizin | | |
| 6,534,405 B1 * | 3/2003 | Wu | ..... | 438/682 |
| 6,642,573 B1 | 11/2003 | Halliyal et al. | ..... | 257/316 |
| 6,744,675 B1 | 6/2004 | Zheng et al. | ..... | 365/185.28 |
| 6,750,066 B1 | 6/2004 | Cheung et al. | ..... | 438/3 |
| 6,869,844 B1 * | 3/2005 | Liu et al. | ..... | 438/264 |
| 2001/0026970 A1 * | 10/2001 | Eitan et al. | ..... | 438/215 |
| 2003/0013263 A1 * | 1/2003 | Basceri et al. | ..... | 438/381 |
| 2003/0178652 A1 | 9/2003 | Kuo et al. | | |

FOREIGN PATENT DOCUMENTS

| | | |
|---|---|---|
| EP | 1 061 580 A2 | 12/2000 |
| EP | 1 061 580 A3 | 5/2001 |
| JP | 58-143566 * | 8/1983 |
| JP | 58-143566 (A) | 8/1983 |

OTHER PUBLICATIONS

2002 IEEE International Solid-State Circuits Conference, Session 6, "SRAM and Non-Volatile Memories," Feb. 4, 2004,6 pages.
2002 IEEE International Solid-State Circuits Conference, 29 pages.
International Search Report and Written Opinion dated Apr. 11, 2006, issued in corresponding PCT Application No. PCT/US2005/038379.

* cited by examiner

*Primary Examiner*—Andy Huynh
*Assistant Examiner*—Hoang-Quan Ho
(74) *Attorney, Agent, or Firm*—Harrity Snyder, LLP (57) ABSTRACT

A semiconductor memory device includes a group of word lines and a structure that is configured to dissipate current from the group of word lines during fabrication of the semiconductor memory device.

19 Claims, 12 Drawing Sheets

SYSTEM AND METHOD FOR PROTECTING SEMICONDUCTOR DEVICES

FIELD OF THE INVENTION

The present invention relates generally to semiconductor manufacturing and, more particularly, to protecting semiconductor devices during fabrication processing.

BACKGROUND OF THE INVENTION

Conventional semiconductor memory devices may use a memory structure characterized by a vertical stack of a tunnel oxide (e.g., $SiO_2$), a polysilicon floating gate over the tunnel oxide, an interlayer dielectric over the floating gate, and a control gate over the interlayer dielectric. The vertical stack may be formed on a crystalline silicon substrate. The substrate may include a channel region positioned below the vertical stack and source and drain on opposing sides of the channel region.

Another type of memory cell structure is characterized by a vertical stack that includes an insulating tunnel oxide layer, a charge trapping nitride layer, an insulating top oxide layer, and a polysilicon control gate, all positioned on top of a crystalline silicon substrate. This particular structure of a silicon channel region, tunnel oxide, nitride, top oxide, and polysilicon control gate is often referred to as a SONOS (silicon-oxide-nitride-oxide-silicon) device. During fabrication of such memory devices, the charge trapping layer may become inadvertently charged, thereby shifting the threshold voltage to an undesirable level and potentially damaging the memory device. Thus, it would be desirable to provide an improved structure that eliminates this problem.

SUMMARY OF THE INVENTION

In an implementation consistent with the principles of the invention, a semiconductor device includes a group of word lines and a capacitor. The semiconductor device further includes a first structure. The first structure is configured to connect each word line of the group of word lines to the capacitor and leak current from the word lines to the capacitor.

In another implementation consistent with the principles of the invention, a semiconductor memory device that includes a group of word lines is disclosed. The semiconductor memory device includes a capacitor, a first structure connected to the capacitor, and a group of second structures. Each of the second structures is associated with a different word line of the group of word lines and is configured to connect the associated word line to the first structure.

In yet another implementation consistent with the principles of the invention, a semiconductor memory device is disclosed. The semiconductor memory device includes a group of word lines and a structure that is configured to dissipate current from the group of word lines during fabrication of the semiconductor memory device.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Exemplary Processing

Figure 1:
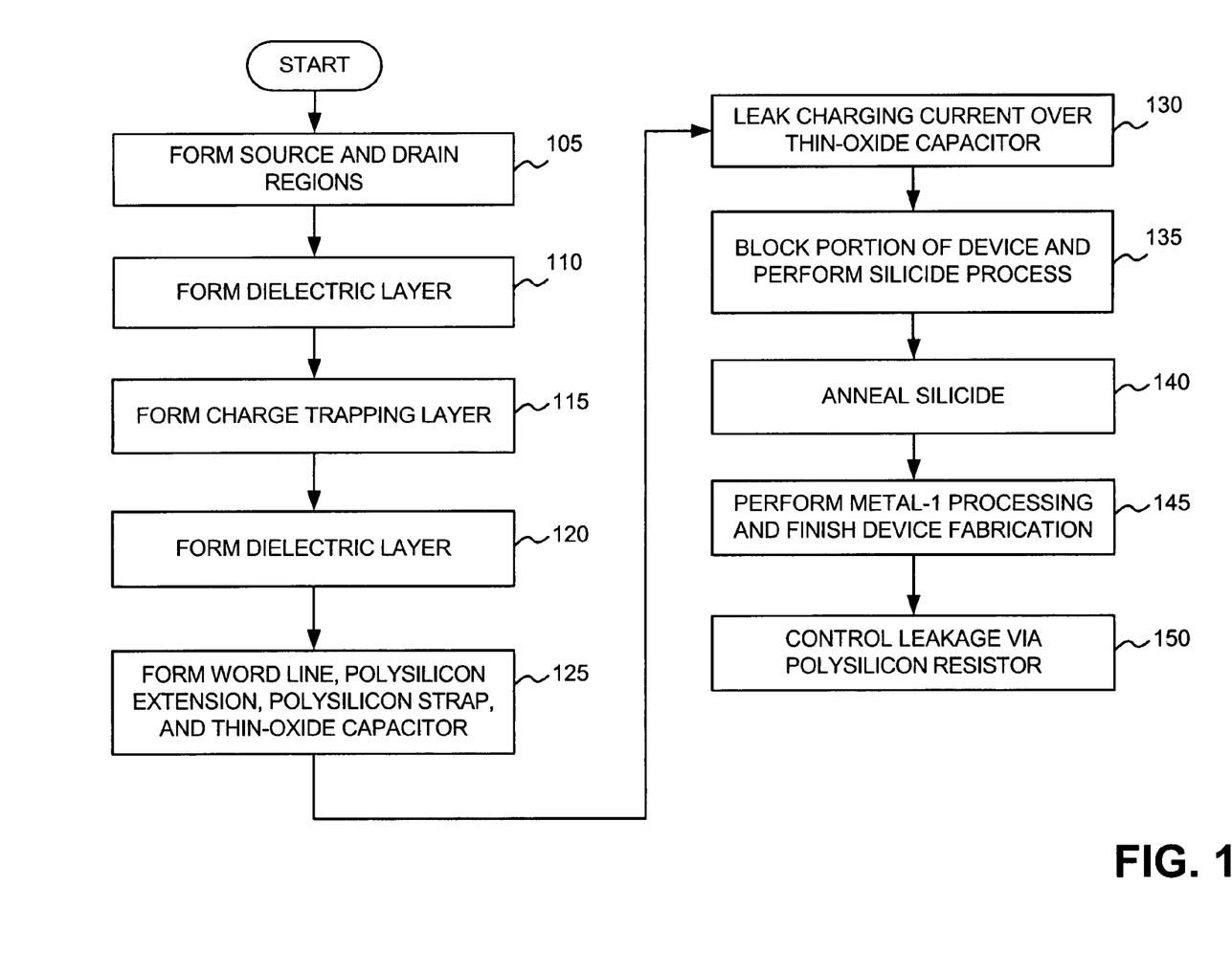
FIG. 1 illustrates an exemplary process for forming a semiconductor memory device in an implementation consistent with the principles of the invention.

FIG. 1 illustrates an exemplary process for forming a semiconductor memory device in an implementation consistent with the principles of the invention. In one implementation, the semiconductor memory device includes a core memory array of a flash memory device. FIGS. 2-9 illustrate exemplary views of a semiconductor memory device fabricated according to the processing described in FIG. 1.

Figure 2:
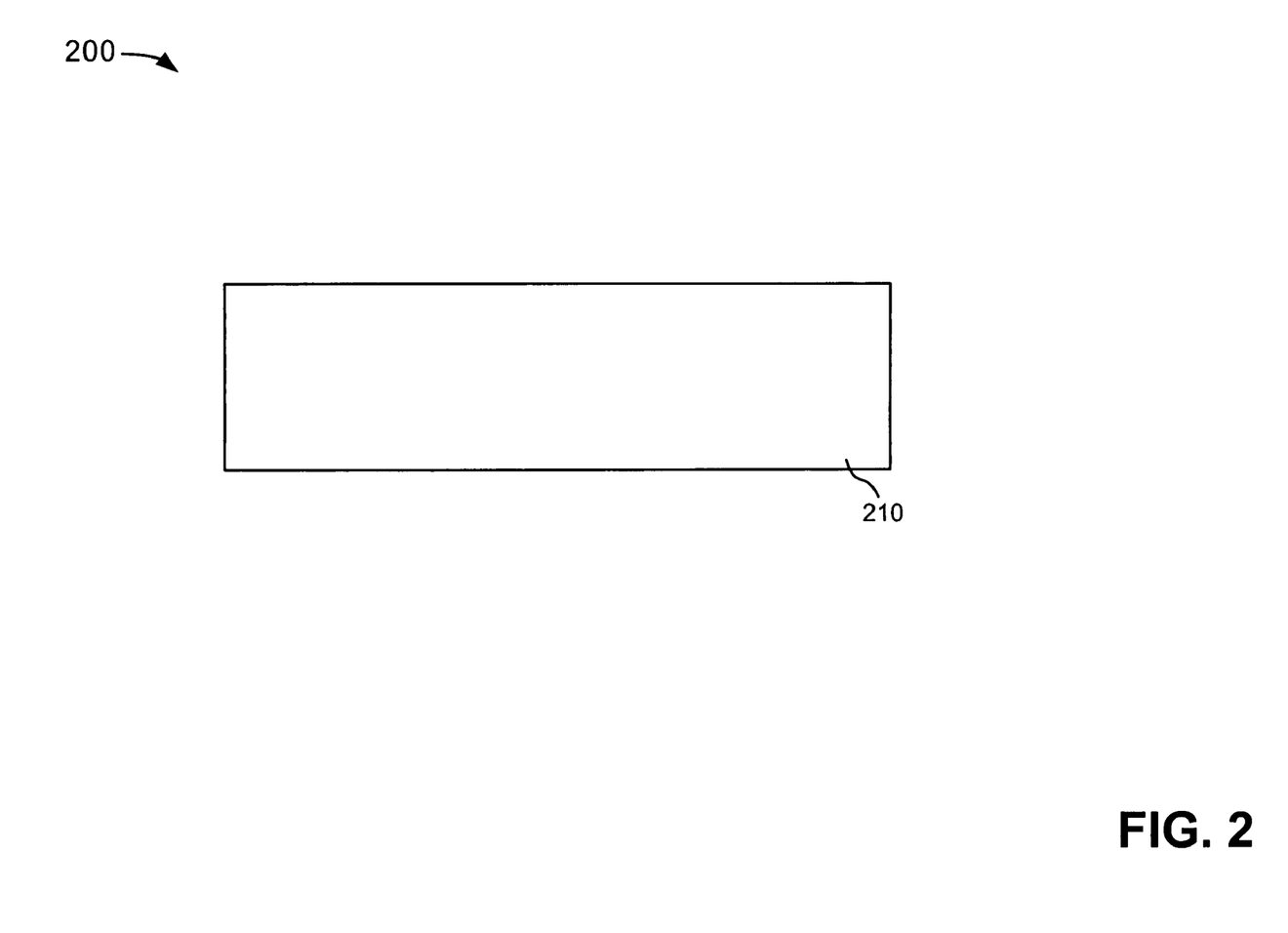
FIGS. 2-10 illustrate exemplary views of a semiconductor memory device fabricated according to the processing described in FIG. 1.

With reference to FIGS. 1 and 2, processing may begin with a semiconductor device 200 that includes a substrate 210. Semiconductor substrate 210 may be any appropriately selected semiconductor substrate known in the art. For example, in one implementation, substrate 210 may comprise silicon or other semiconducting materials, such as germanium, or combinations of semiconducting materials, such as silicon-germanium.

Figure 3:
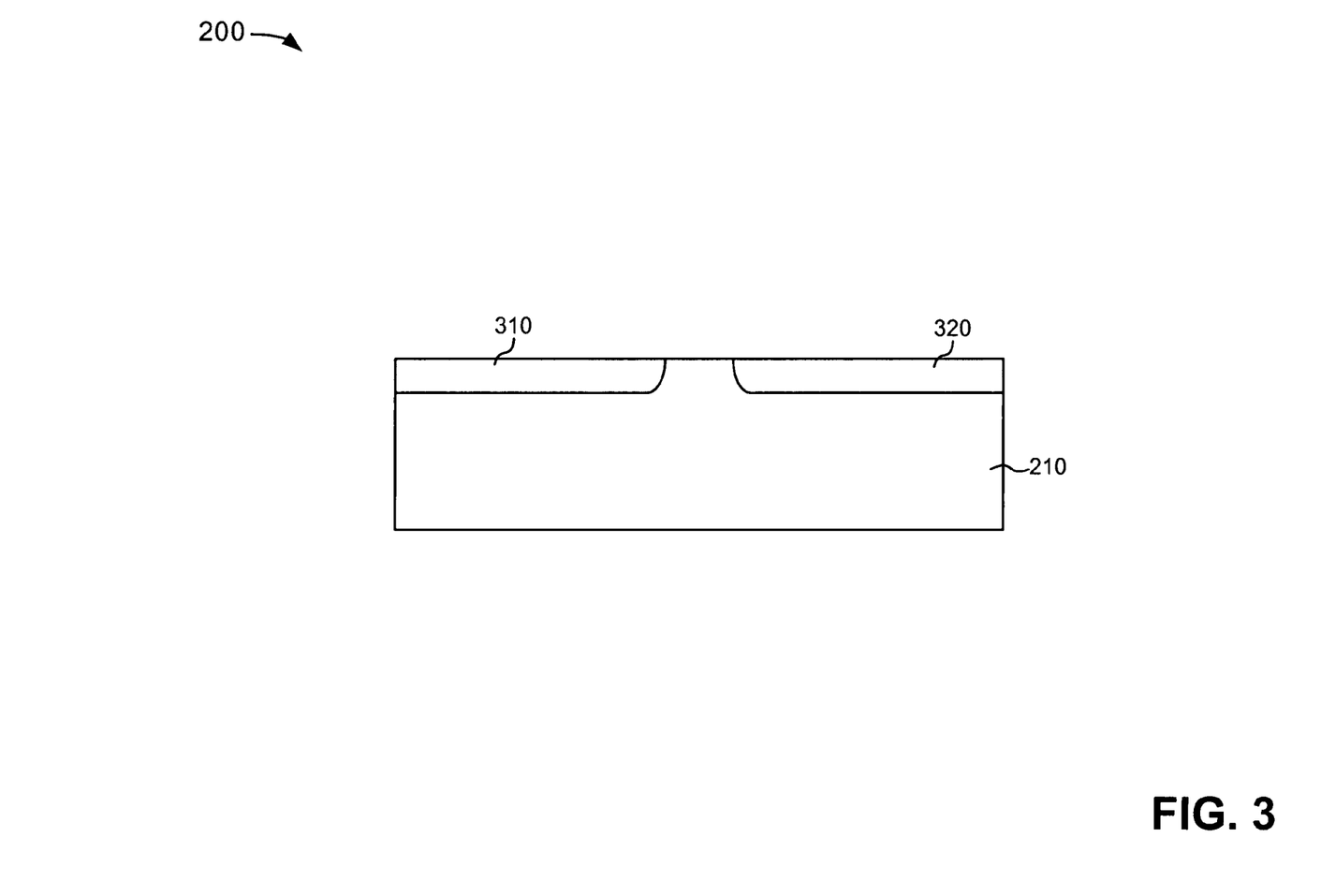

A source region 310 and a drain region 320 may be formed in a well-known manner, as illustrated in FIG. 3 (act 105). For example, an oxide layer may be formed on active substrate 210 and etched back to form a structure that essentially acts as a mask to prevent doping in a channel region of substrate 210. Substrate 210 may be doped to produce source region 310 and drain region 320. The oxide structure may be subsequently removed. In one implementation, source region 310 and drain region 320 may be formed by a main perpendicular implant process. The main perpendicular implant may be a relatively high energy, high concentration implant that is capable of producing source 310 and the drain 320. In one implementation, a p-type dopant, such as boron may be used as the dopant. Alternatively, an n-type dopant, such as arsenic or phosphorous, may be used as the dopant. The dopant atoms may be implanted at a dosage of about $5\times10^{14}$ atoms/cm$^2$ to about $2\times10^{15}$ atoms/cm$^2$ and an implantation energy of about 2 KeV to about 50 KeV, which may depend on the desired junction depths for source/drain regions 310 and 320. It should also be understood that the formation of source region 310 and drain region 320 may take place at a later point in the fabrication process of device 200.

Figure 4:
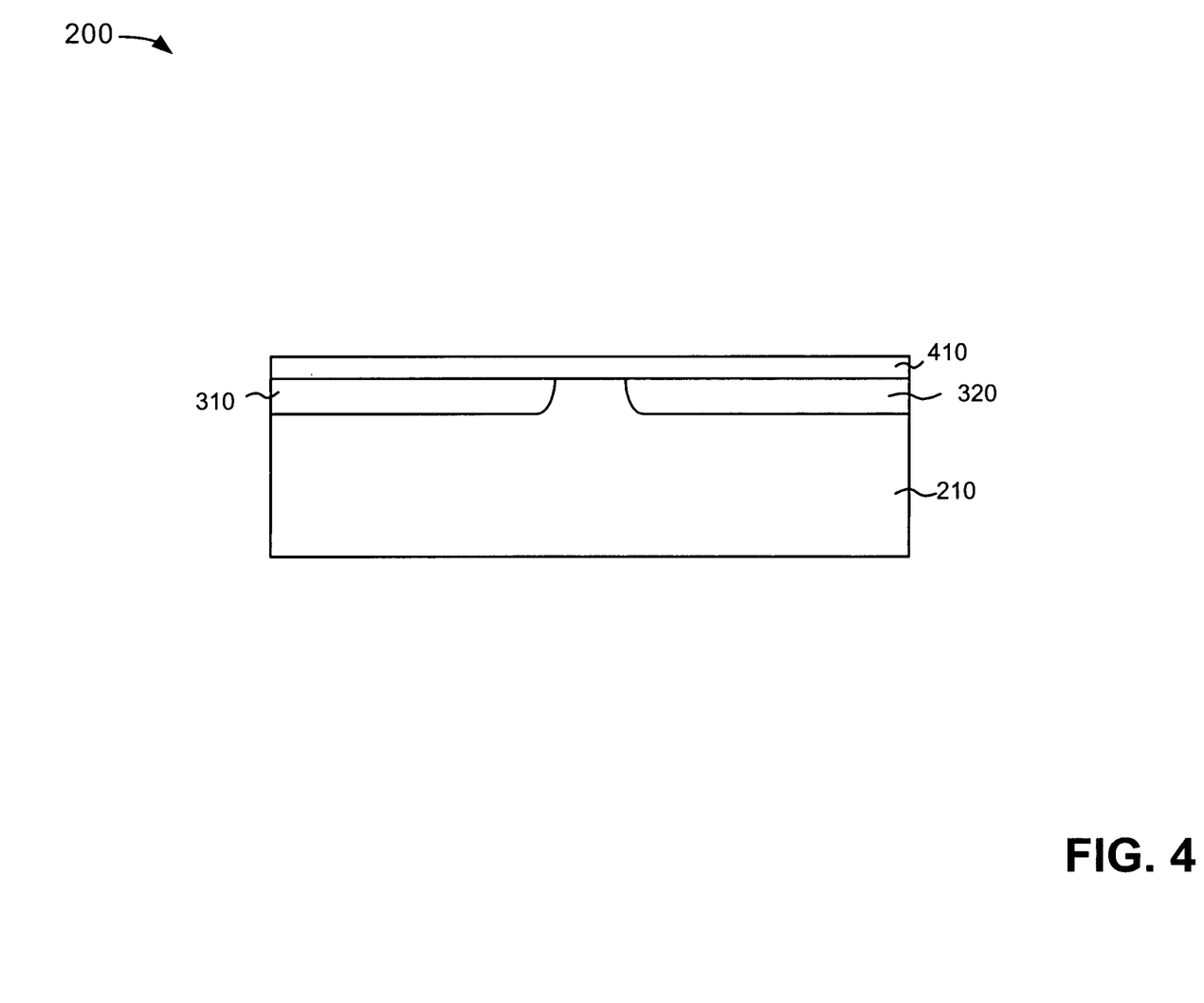

A dielectric layer 410, such as a silicon oxide layer, may be formed on device 200, as illustrated in FIG. 4 (act 110). In one implementation, dielectric layer 410 may comprise SiO$_2$ and may be deposited using chemical vapor deposition (CVD) (or thermally grown) to a thickness ranging from about 40 Å to about 100 Å. It will be appreciated that dielectric layer 410 may comprise other materials that may be deposited or grown.

Figure 5:
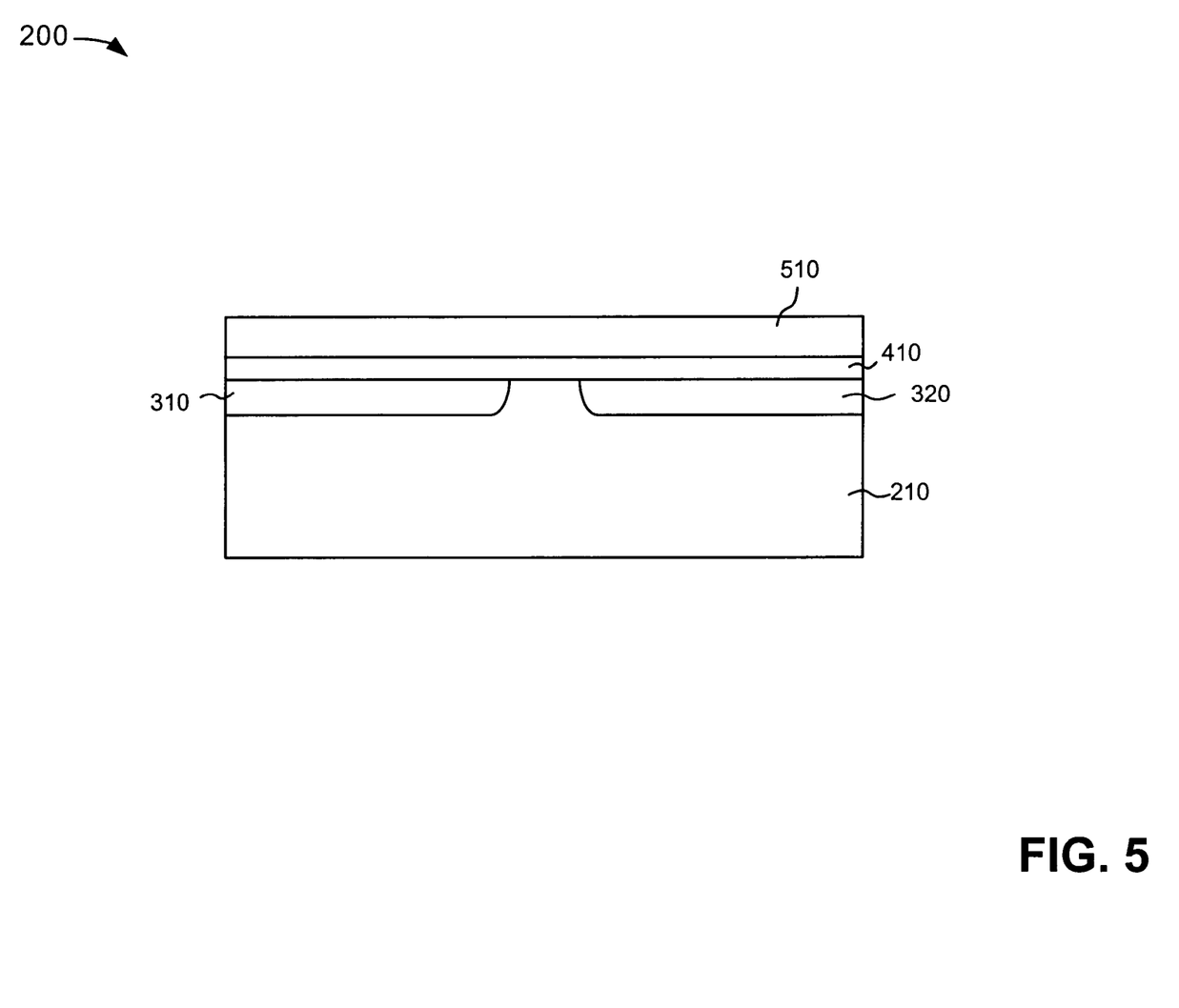

A charge trapping layer 510 may be formed on dielectric layer 410 (act 115). In one implementation, charge trapping layer 510 may be formed, for example, from a non-conductive material, such as a silicon nitride material, a silicon oxide material, or another dielectric material, and may be deposited to a thickness ranging from about 60 Å to about 120 Å.

Figure 6:
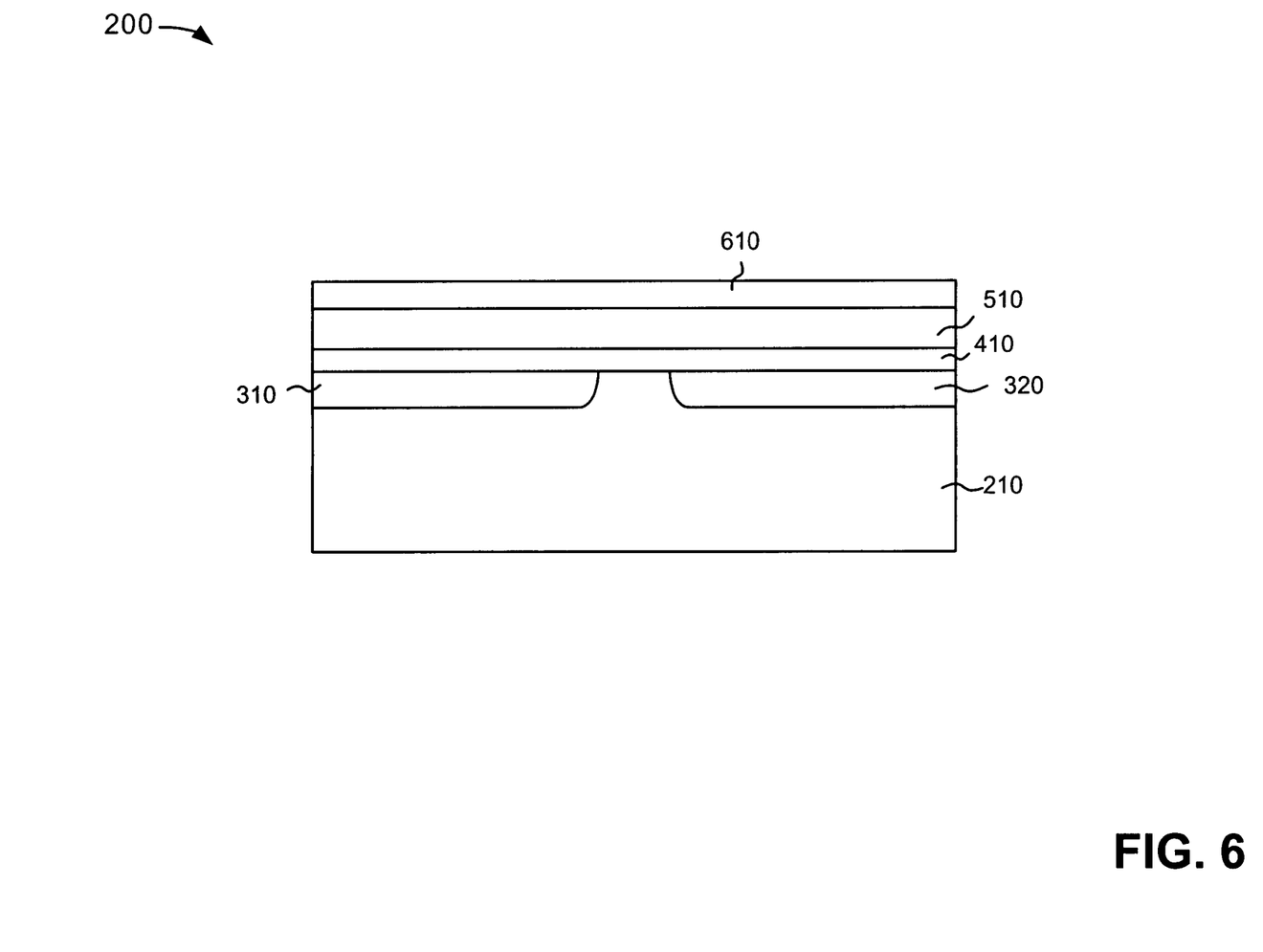

A dielectric layer 610 may be formed on charge trapping layer 510, as illustrated in FIG. 6 (act 120). In an exemplary implementation, dielectric layer 610 may comprise silicon dioxide or another material formed to a thickness ranging from about 50 Å to about 150 Å.

Figure 7:
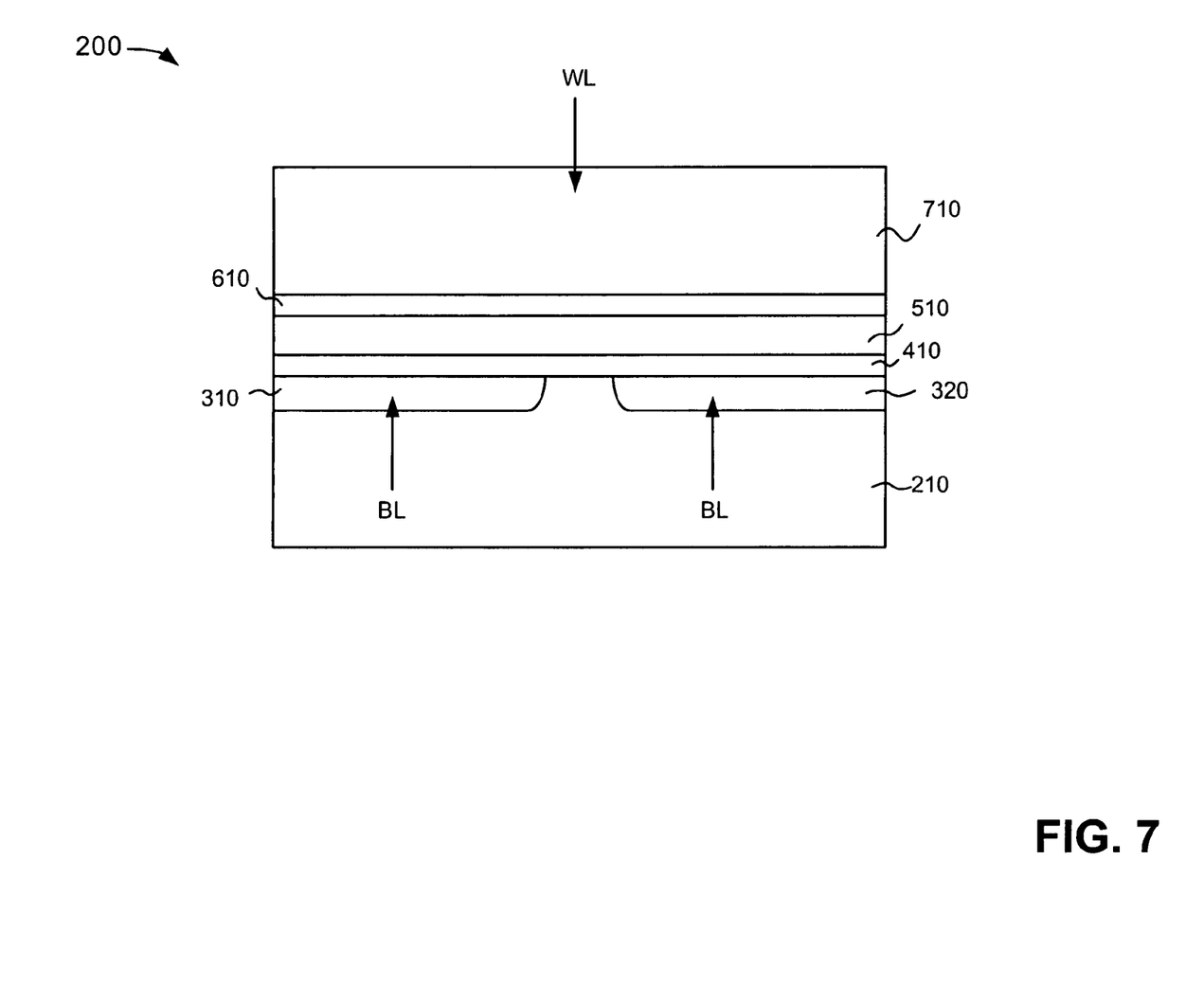

A polysilicon layer may be deposited, patterned, and etched to form word line 710 over dielectric layer 610, as illustrated in FIG. 7 (act 125). As will be appreciated, word line 710 may function as a control gate electrode. Moreover, source and/or drain regions 310 and 320 may serve as bit lines for device 200. In one implementation, the polysilicon layer may be deposited to a thickness ranging from about 500 Å to about 3000 Å. While the formation of a single source region 310, drain region 320, and word line 710 is described above, it will be appreciated that device 200 may include an array of memory cells with multiple source regions 310, drain regions 320, and word lines 710.

Figure 8:
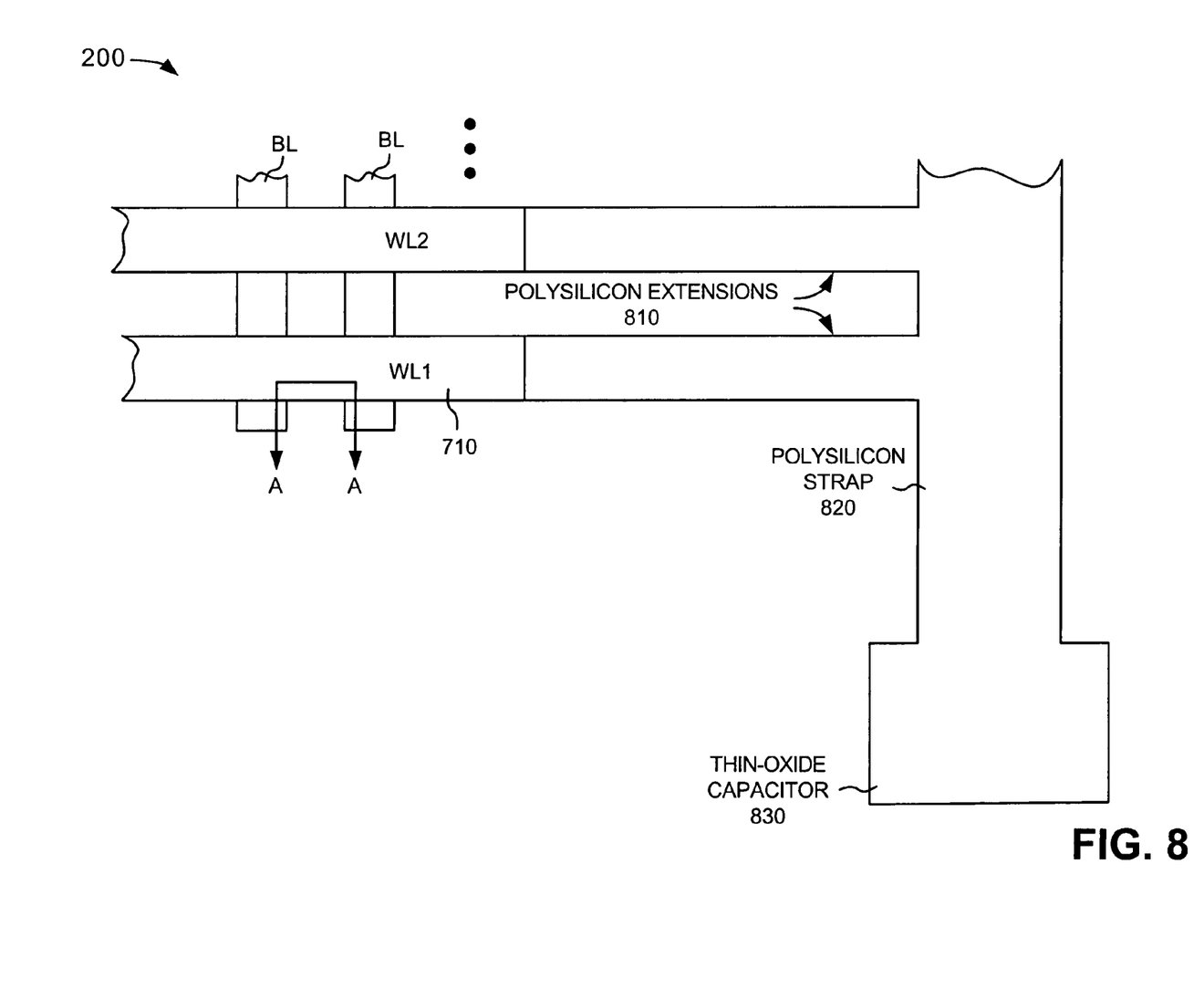

Although not shown in FIG. 7, the polysilicon layer may be further patterned and etched to form a polysilicon extension 810, a polysilicon strap 820, and a thin-oxide capacitor 830, as illustrated in the exemplary top view of device 200 in FIG. 8 (act 125). As a point of reference, the exemplary cross-sectional view illustrated in FIG. 7 is taken along line A-A, depicted in FIG. 8.

Each polysilicon extension 810 may connect an associated word line 710 to polysilicon strap 820. In one implementation, polysilicon extensions 810 may be formed to a width ranging from approximately 0.10 μm to approximately 0.20 μm (e.g., 0.16 μm) and a length ranging from about 1 μm to about 5 μm. The height of polysilicon extensions 810 may be similar to the height of word lines 710 (i.e., about 500 Å to about 3000 Å). It will be appreciated that other dimensions may alternatively be used.

Polysilicon strap 820 may connect word lines 710, via polysilicon extensions 810, to thin-oxide capacitor 830. In one implementation, polysilicon strap 820 may be formed to a width ranging from about 0.5 μm to about 2 μm (or wide enough so that sheet resistance is minimized) and a length ranging from about 50 μm to about 200 μm. The length of polysilicon strap 820 may approximately equal the length of the core sector of device 200, which may be determined by multiplying the word line pitch by the number of word lines 710 per sector. The height of polysilicon strap 820 may be similar to the height of word lines 710 (i.e., about 500 Å to about 3000 Å). It will be appreciated that other dimensions may alternatively be used.

Thin-oxide capacitor 830 may be formed to a width ranging from about 1 μm to about 10 μm and a length ranging from about 1 μm to about 10 μm. The height of thin-oxide capacitor 830 may be similar to the height of word lines 710 (i.e., about 500 Å to about 3000 Å). It will be appreciated that other dimensions may alternatively be used. Thin-oxide capacitor 830 may have a capacitance ranging from about 2 femtofarads to about 700 femtofarads.

During the above processing, charge trapping layer 510 may become inadvertently charged, which may shift the threshold voltage (Vt) of the memory cells in the array to an undesirable level. Polysilicon extensions 810 and polysilicon strap 820 may serve to leak the process charging current from charge trapping layer 510 over thin-oxide capacitor 830 (act 130). In this way, inadvertent charging of charge trapping layer 510 may be prevented during the fabrication of device 200.

Figure 9A:
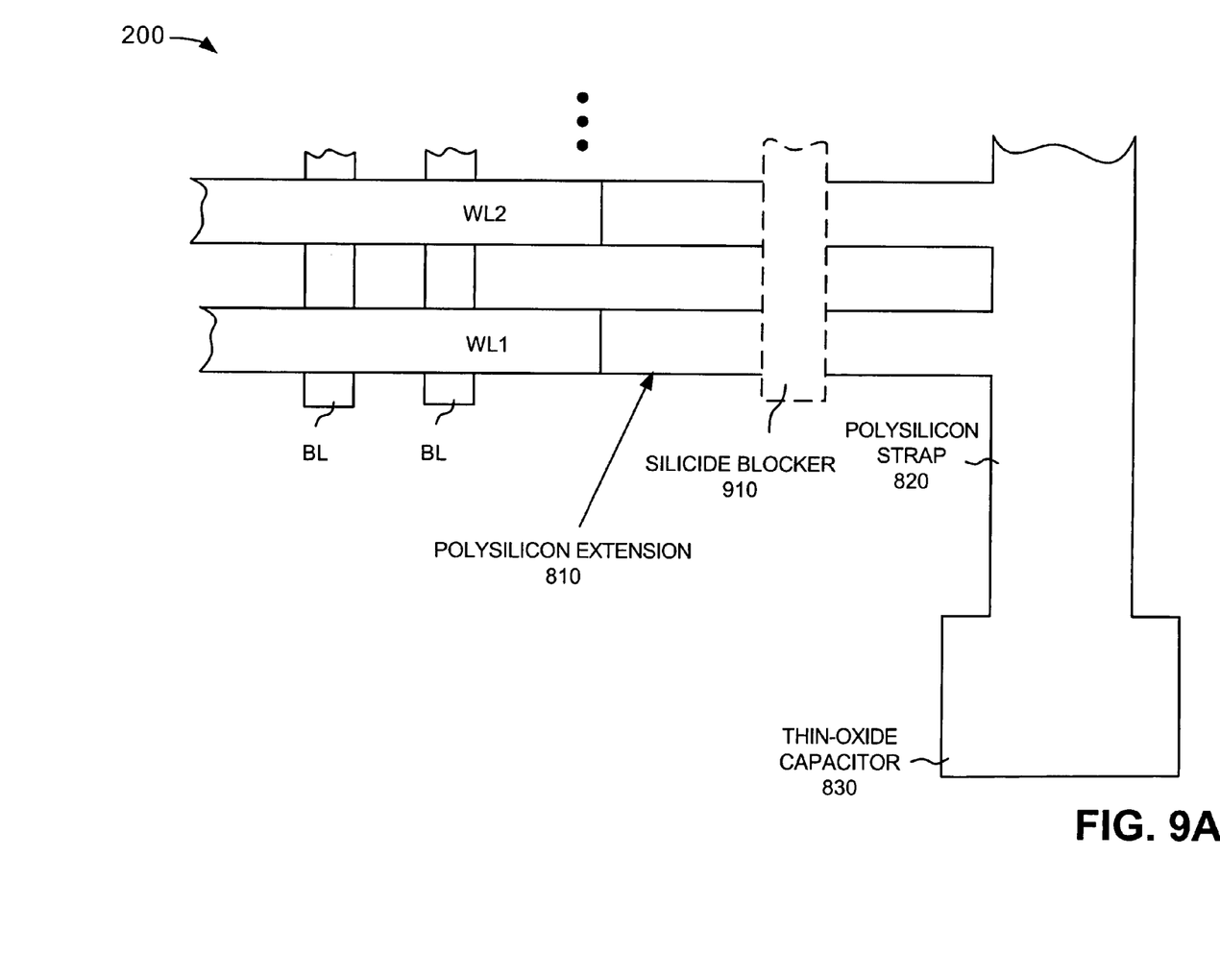
Figure 9B:
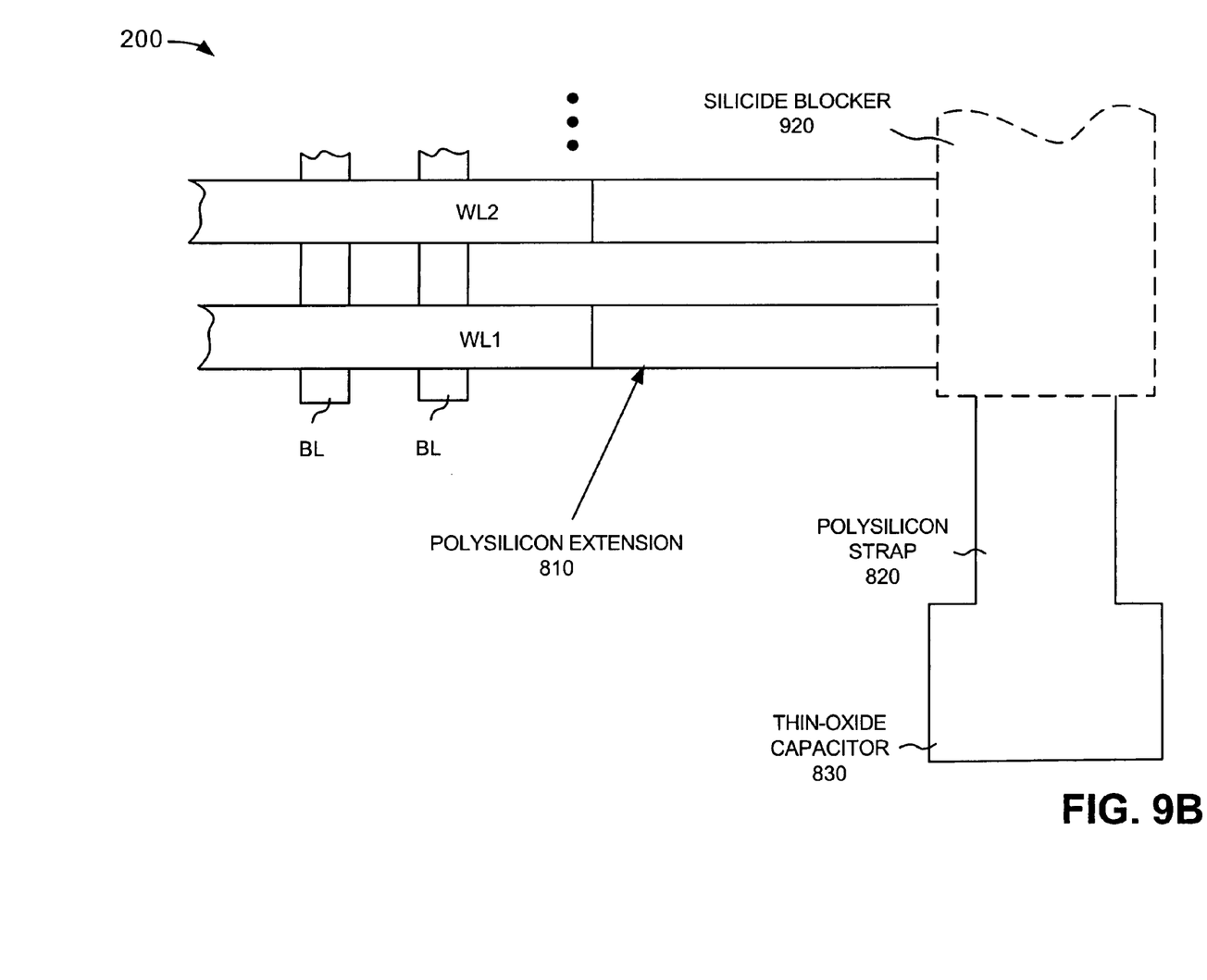

A portion of device 200 may be blocked (or masked) and a silicide process may be performed (act 135). For example, a material, such as nitride, may be deposited and etched to form a silicide blocker. In one implementation, as illustrated in FIG. 9A, a portion 910 of polysilicon extensions 810 may be blocked from the silicide process. An exemplary length of polysilicon extensions 810 that is blocked may range from about 1 μm to about 2 μm. Portion 910 may act to drastically limit the current leakage during operating conditions, but allow for high enough leakage during process charging. In one implementation, the distance from the edge of portion 910 to the edge of polysilicon strap 820 may be governed by the degree of control of mask misalignment (i.e., the silicide-block mask may be made of a cheaper "non-critical alignment" mask that may need 0.5 μm of misalignment tolerance). In an alternative implementation, as illustrated in FIG. 9B, a portion of polysilicon extensions 810 and a portion of polysilicon strap 820 may be blocked from the silicide process (illustrated in FIG. 9B as element 920). In both of the above implementations, Schottky silicided-to-unsilicided junctions may be formed between the silicided portions of device 200 and the unsilicided portions with an intervening region of high resistance grain boundaries. For example, in FIG. 9A, a Schottky silicided-to-unsilicided junction may be formed on the left and right sides of silicide block 910 on each polysilicon extension 810. As will be appreciated, the intervening region of high resistance forms a polysilicon resistor in device 200.

During the silicide process, a metal layer may be deposited over device 200. In an exemplary implementation, the metal layer may include cobalt, nickel, or another metal, and may be deposited to a thickness ranging from about 500 Å to about 5000 Å. A thermal annealing process may then be performed to form a metal-silicide layer (act 135). During the annealing, the metal may react with the polysilicon to form a metal-silicide compound, such as CoSi$_2$ or NiSi, based on the particular metal layer deposited. The metal-silicide compound, however, will not be formed over the blocked areas (e.g., areas 910 and 920 in FIGS. 9A and 9B, respectively).

Figure 10:
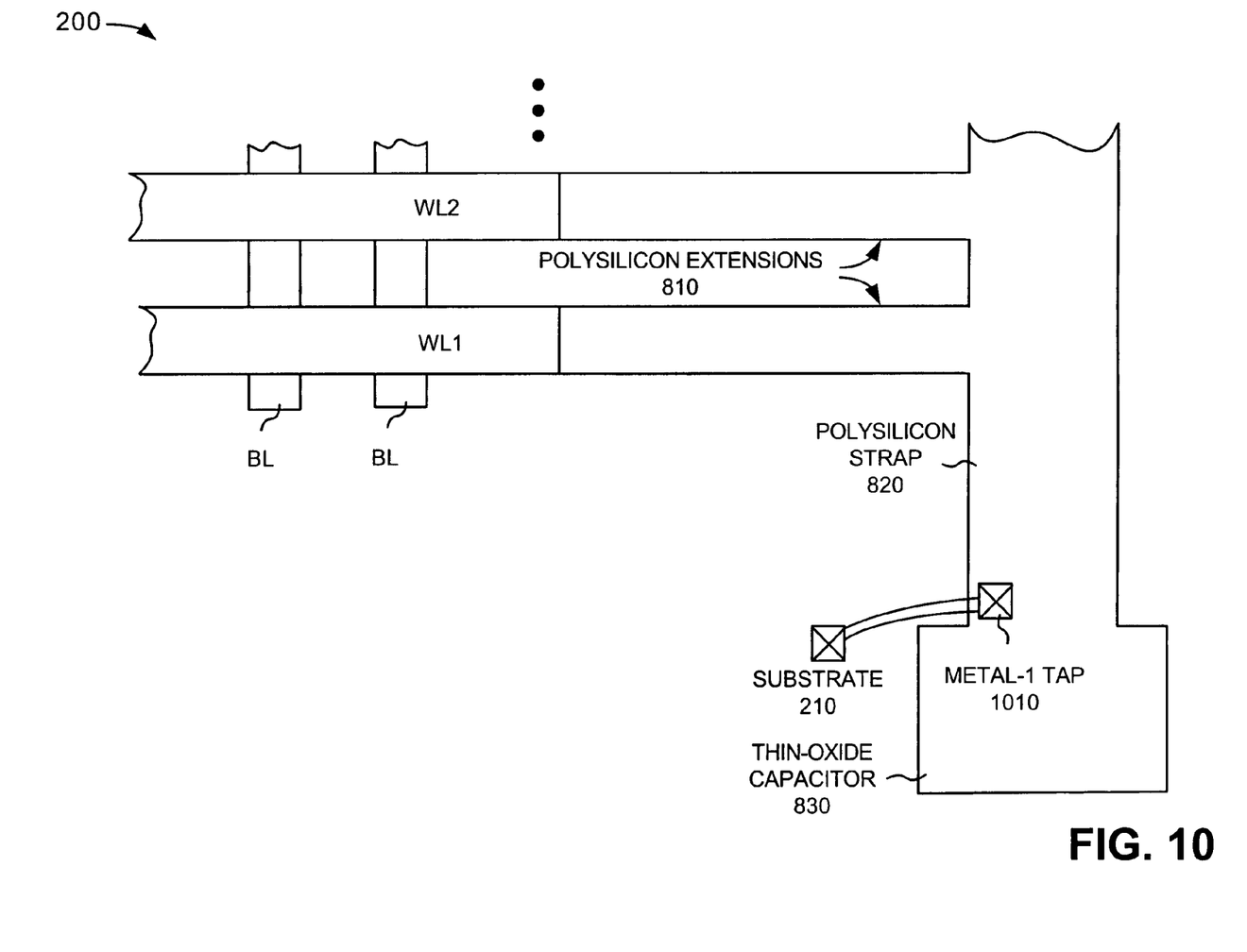

Metallization may then be performed to form contacts and interconnects for device 200 (act 145). For example, a metal-1 layer may be deposited, patterned, and etched. The metal-1 layer may comprise copper, aluminum, or another metal. In one implementation, a metal-1 tap 1010 is formed from polysilicon strap 820 to substrate 210, as illustrated in FIG. 10. Metal-1 tap 1010 acts to leak charging currents from charge trapping layer 510 directly to substrate 210.

Fabrication processing of device 200 may be completed (act 145). During operating conditions (e.g., read, program, and erase) of device 200, leakage is controlled by the polysilicon resistors formed during the silicide process (act 150). For example, during read operations, the gate voltage may be quite low (e.g., approximately 5 volts) and the leakage through the polysilicon resistors may be negligible in the operating temperature range of approximately −40° C. to approximately 90° C. During program operations, up to approximately 10 volts may be applied on a selected word line 710. Since typically only a few word lines 710 are selected at one time, the polysilicon resistors can be designed to have a relatively high resistance, thereby causing a low leakage (usually less than about 1 μA). During erase operations, a bias of approximately −6 volts may be applied to all word lines 710 in a sector (which may, in some implementations, consist of approximately 512 word lines). As in the above situations, the polysilicon resistors can be designed to have a high resistance to cause an appropriately low leakage. It will be appreciated that a desired resistance level may be achieved by adjusting the size of the non-silicided portions of device 200.

Figure 11:
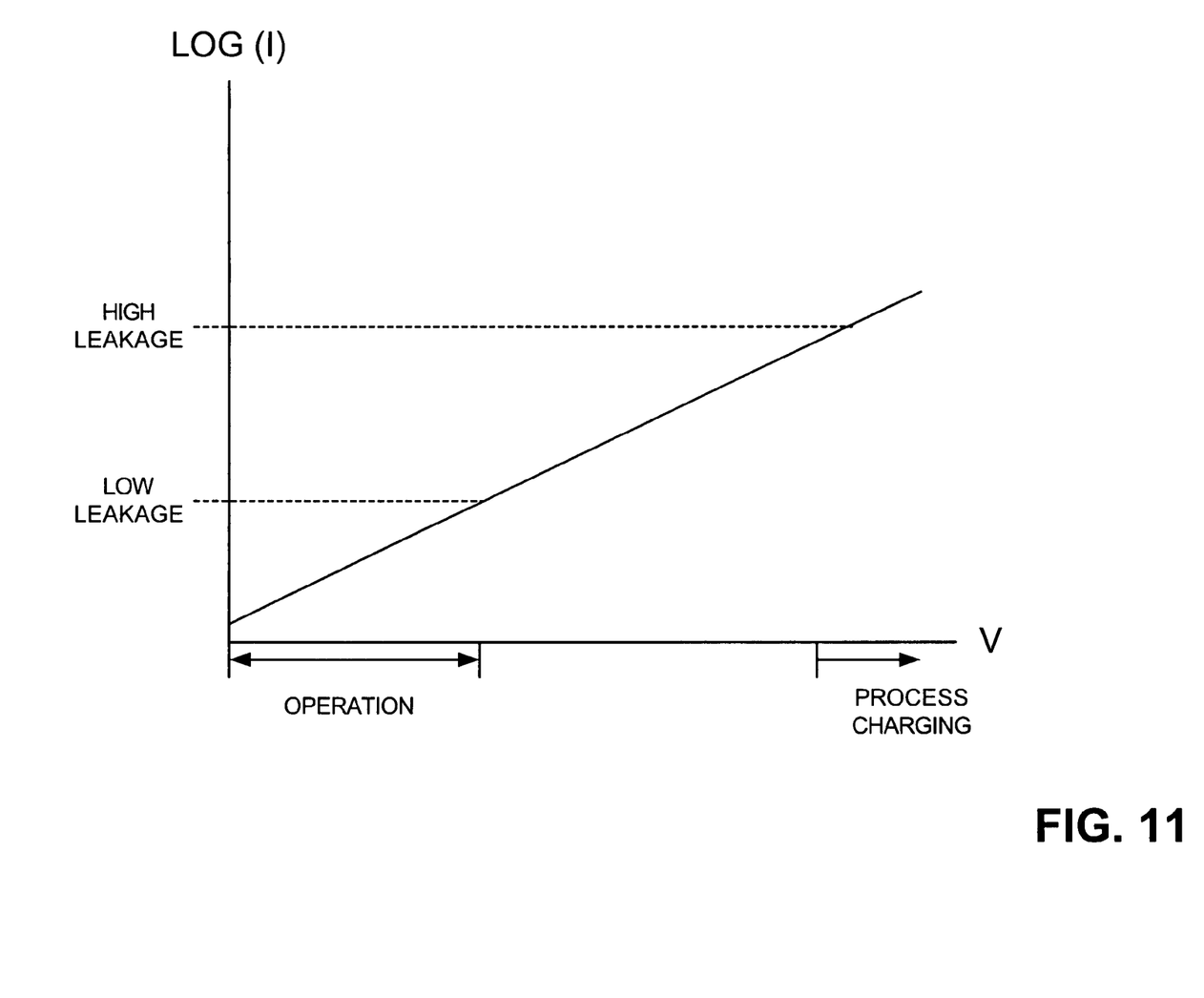
FIG. 11 illustrates an exemplary plot of leakage current versus applied voltage for a semiconductor memory device in an implementation consistent with the principles of the invention.

FIG. 11 is an exemplary plot of the current (I) versus voltage (V) behavior of the polysilicon resistor. More specifically, the curve in FIG. 11 is represented as a logarithm of the leakage current versus applied voltage. As illustrated, at lower voltages (e.g., less than 10 volts, which is typical of operating conditions), the leakage from word line 710 charging pumps through the polysilicon resistors is low enough not to degrade the word line voltage. Since leakage increases exponentially with applied voltage across device 200, at high voltage, which may be present during process charging, there is sufficient leakage current such that the charging currents associated with the device fabrication will leak out and thereby not affect the threshold voltage of the memory device.

Thus, in implementations consistent with the principles of the invention, a semiconductor memory device may be formed to include a polysilicon resistor that, in essence, acts as a fuse during process charging thereby providing good protection to the semiconductor memory device. During program/read/erase operations, the current leakage is so low as to be negligible.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A semiconductor memory comprising:
   a plurality of charge trapping layers;
   a plurality of word lines, where each charge trapping layer is electrically insulated from a word line of the plurality of word lines;
   a capacitor;
   a first structure connected to the capacitor; and
   a plurality of second structures, each of the second structures being associated with a different word line of the plurality of word lines and being configured to connect the associated word line to the first structure.

2. The semiconductor memory device of claim 1 wherein the first structure is configured to leak current from the plurality of word lines to the capacitor.

3. The semiconductor memory device of claim 1 wherein a length of each of the plurality of second structures ranges from about 1 μm to 5 μm.

4. The semiconductor memory device of claim 1 wherein each of the second structures comprises a silicided portion and an unsilicided portion.

5. The semiconductor memory device of claim 4 wherein the first structure comprises a silicided portion and an unsilicided portion, and
   wherein the unsilicided portion of each second structure is located adjacent to the unsilicided portion of the first structure.

6. The semiconductor memory device of claim 1 wherein the first structure connects to a substrate of the semiconductor memory device via a metal-1 tap.

7. A semiconductor memory device comprising:
   a vertical stack including a charge trapping layer electrically insulated from one word line of a plurality of word lines; and
   a structure configured to dissipate current from the plurality of word lines during fabrication of the semiconductor memory device, the structure comprising:
   a thin-oxide capacitor,
   a polysilicon strap connected to the thin-oxide capacitor, and
   a plurality of polysilicon extensions, each polysilicon extension being connected to a different word line of the plurality of word lines and connecting the word line to the polysilicon strap.

8. The semiconductor memory device of claim 7 wherein the polysilicon strap connects to a substrate of the semiconductor memory device via a metal-1 tap.

9. A memory cell comprising:
a vertical stack including a charge trapping layer electrically insulated from a word line disposed on the stack;
a capacitor electrically coupled to the word line;
a first structure to connect the word line to the capacitor and leak current from the word line to the capacitor; and
a metal-1 tap configured to connect the first structure to a substrate and leak current to the substrate.

10. The memory cell of claim 9 wherein the charge trapping layer is formed from one of a silicon nitride material, a silicon oxide material, or another dielectric material.

11. The memory cell of claim 9 wherein the word line, the capacitor, and the first structure are formed of a same material.

12. The memory cell of claim 11 wherein the same material comprises polysilicon.

13. The memory cell of claim 9 wherein the word line is associated with an extension that connects the word line to the first structure.

14. The memory cell of claim 13 wherein a length of the extension ranges from about 1 μm to about 5 μm.

15. The memory cell of claim 13 wherein the extension comprises a silicided portion and an unsilicided portion.

16. The memory cell of claim 15 wherein a length of the unsilicided portion of the extension ranges from about 1 μm to about 2 μm.

17. The memory cell of claim 15 wherein the first structure comprises a silicided portion and an unsilicided portion, and wherein the unsilicided portion of the extension is located adjacent to the unsilicided portion of the first structure.

18. The memory cell of claim 9 wherein a height of each of the word line, the capacitor, and the first structure ranges from about 500 Å to about 3000 Å.

19. The memory cell of claim 9 wherein the first structure is configured to leak current from the word line to the capacitor during process charging.

* * * * *